United States Patent
Koerner et al.

(10) Patent No.: US 9,941,181 B2
(45) Date of Patent: Apr. 10, 2018

(54) CHIP PACKAGE AND METHOD OF FORMING A CHIP PACKAGE

(71) Applicant: Infineon Technologies AG, Neubiberg (DE)

(72) Inventors: Heinrich Koerner, Bruckmuehl (DE); Michael Bauer, Nittendorf (DE); Reimund Engl, Munich (DE); Michael Huettinger, Munich (DE); Werner Kanert, Holzkirchen (DE); Joachim Mahler, Regensburg (DE); Brigitte Ruehle, Holzkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/599,492

(22) Filed: May 19, 2017

(65) Prior Publication Data
US 2017/0338164 A1   Nov. 23, 2017

(30) Foreign Application Priority Data
May 20, 2016  (DE) .......... 10 2016 109 356

(51) Int. Cl.
| | |
|---|---|
| *H01L 23/28* | (2006.01) |
| *H01L 23/29* | (2006.01) |
| *H01L 21/56* | (2006.01) |
| *H01L 23/00* | (2006.01) |

(52) U.S. Cl.
CPC .......... *H01L 23/293* (2013.01); *H01L 21/56* (2013.01); *H01L 23/295* (2013.01); *H01L 23/296* (2013.01); *H01L 24/48* (2013.01); *H01L 2224/48647* (2013.01); *H01L 2924/01029* (2013.01); *H01L 2924/365* (2013.01)

(58) Field of Classification Search
CPC ............ H01L 35/16; H01L 31/56; H01L 2224/48247; H01L 31/048; H01L 23/28
USPC .......... 257/784, 787; 438/112, 127
See application file for complete search history.

(56) References Cited

U.S. PATENT DOCUMENTS

| | | | | | |
|---|---|---|---|---|---|
| 2,915,724 | A | * | 12/1959 | Fritts | H01B 1/00 136/203 |
| 6,762,508 | B1 | * | 7/2004 | Kiso | B32B 17/04 136/251 |

(Continued)

OTHER PUBLICATIONS

Bae et al.,"Comprehensive Intermetallic Compound Phase Analysis and Its Thermal Evolution at Cu Wirebond Interface"; IEEE Electronic Components and Technology Conference, 2014, pp. 1562-1570.

(Continued)

*Primary Examiner* — S. V. Clark
(74) *Attorney, Agent, or Firm* — Viering, Jentschura & Partner mbB

(57) ABSTRACT

In various embodiments, a chip package is provided. The chip package may include a chip including a chip metal surface, a metal contact structure electrically contacting the chip metal surface, and packaging material including a contact layer being in physical contact with the chip metal surface and/or with the metal contact structure; wherein at least in the contact layer of the packaging material, a summed concentration of chemically reactive sulfur, chemically reactive selenium and chemically reactive tellurium is less than 10 atomic parts per million.

13 Claims, 6 Drawing Sheets

(56) References Cited

U.S. PATENT DOCUMENTS

| | | | |
|---|---|---|---|
| 7,705,472 B2* | 4/2010 | Mahler | H01L 23/296 257/783 |
| 2003/0052420 A1 | 3/2003 | Suzuki et al. | |
| 2007/0262472 A1* | 11/2007 | Okada | H01L 23/24 257/787 |
| 2012/0273954 A1 | 11/2012 | Higgins | |
| 2013/0241088 A1* | 9/2013 | Onai | C08G 77/12 257/791 |
| 2014/0191841 A1 | 7/2014 | Boday et al. | |

OTHER PUBLICATIONS

Lee et al., "Copper versus Palladium Coated Copper Wire Process and Reliability Differences"; IEEE Electronic components and Technology Conference 2014, pp. 1539-1548.

Villa et al., "Extended Lifetime Study of Copper and Copper-Palladium Bonding Wires", Automotive Electronics Council (AEC) Annual Reliability Workshop, Apr. 28-30, 2015, Detroit.

Krinke et al., "High temperature degradation of palladium coated copper bond wires"; Microelectronics Reliability, 2014, 6 pages, vol. 54, issue 9-10.

* cited by examiner

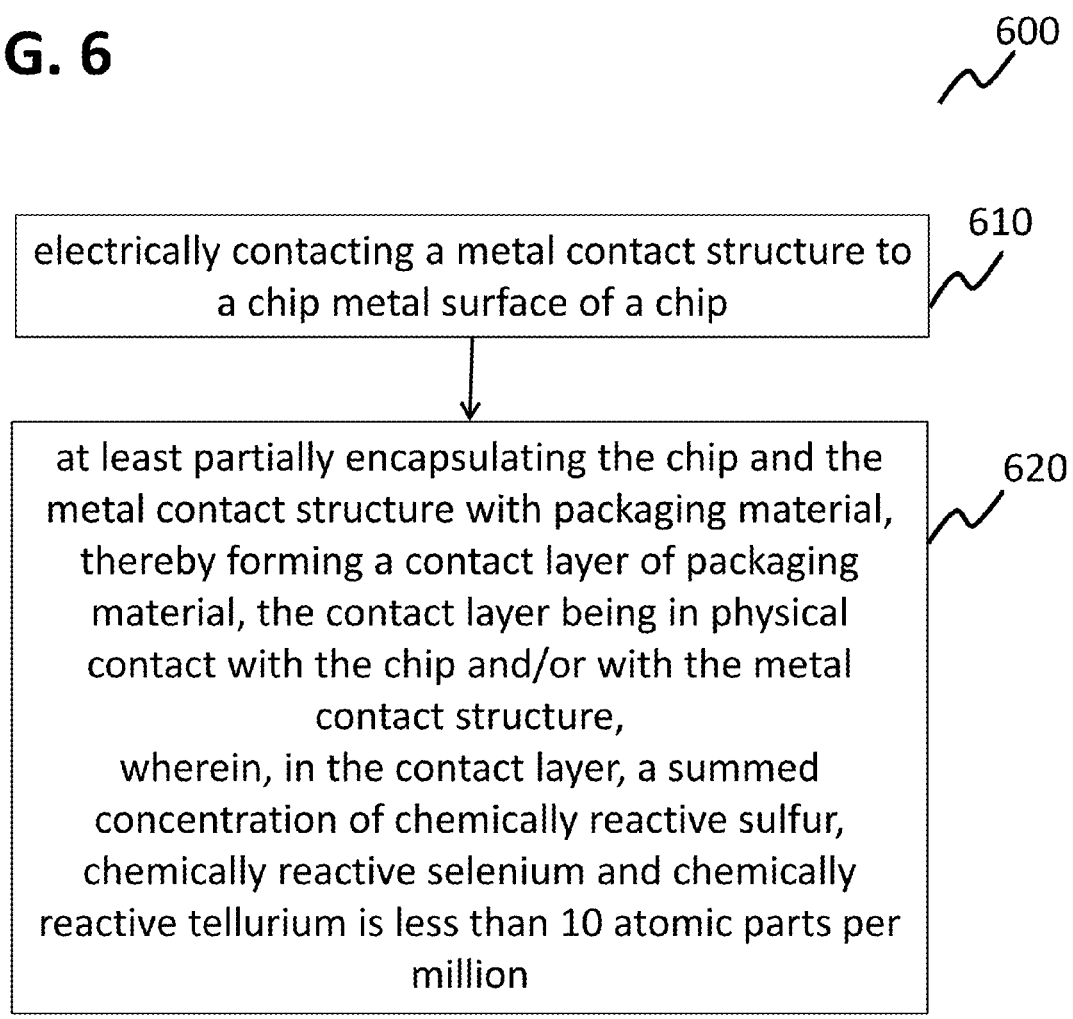

CHIP PACKAGE AND METHOD OF FORMING A CHIP PACKAGE

CROSS-REFERENCE TO RELATED APPLICATION

This application claims priority to German Patent Application Serial No. 10 2016 109 356.4, which was filed May 20, 2016, and is incorporated herein by reference in its entirety.

TECHNICAL FIELD

Various embodiments relate generally to a chip package and to a method of forming a chip package

BACKGROUND

A chip package may usually include a chip, a metal contact structure electrically contacting the chip, and packaging material at least partially enclosing the chip and the metal contact structure. The metal contact structure may provide an electrically conductive connection to the chip from outside the packaging material. The metal contact structure may include a bond wire, which may include or consist of copper (Cu). Bond wires made of bare Cu material may have a significant cost advantage compared to gold (Au) wire, which has been, and still is, the main wire material used. However, Cu wire may have some technological disadvantages and drawbacks, which hindered its rapid usage and industrial acceptance. For example, copper is easily oxidized at ambient air. Therefore, its shelf life time is very limited and strict rules may be applied in assembly fabs (e.g. shipment in sealed packages with inert media, limited hours of usage once the sealed package is opened, etc.).

Furthermore, Cu bond interconnects may often and more easily (e.g. more easily than interconnects using gold wire) undergo corrosion in stress tests using moisture levels (e.g. Temperature Humidity Bias (THB), Highly Accelerated Stress Test (HAST), Unbiased Temperature/Humidity Accelerated Stress Test (UHAST), or Unbiased Temperature/Humidity Autoclave (AC)).

And yet furthermore, Cu wedge bond interconnects may show weak bonding and adhesion, especially on surfaces which are coated with noble metals (e.g. gold (Au), silver (Ag), or palladium (Pd)) and which have a smooth, not roughened surface.

Similar drawbacks may occur for silver (Ag) wires used as bond wires.

SUMMARY

In various embodiments, a chip package is provided. The chip package may include a chip including a chip metal surface, a metal contact structure electrically contacting the chip metal surface, and packaging material including a contact layer being in physical contact with the chip metal surface and/or with the metal contact structure; wherein at least in the contact layer of the packaging material, a summed concentration of chemically reactive sulfur, chemically reactive selenium and chemically reactive tellurium is less than 10 atomic parts per million.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a process flow for a method of forming a chip package according to various embodiments.

DESCRIPTION

Figure 1A:
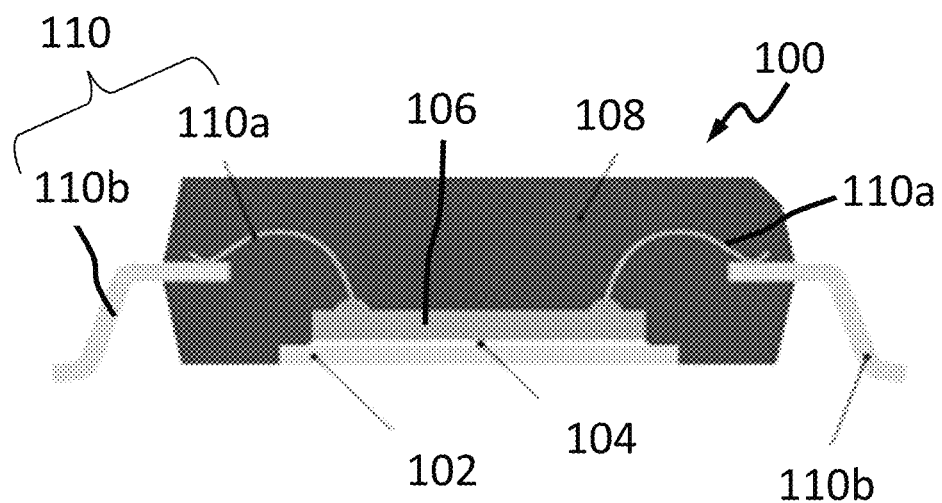
FIG. 1A shows a cross sectional view of a chip package.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Many of the examples presented herein refer to a "sulfur-induced corrosion phenomenon" with copper (Cu), having Cu-sulfide ($CuS_x$) as corrosion product or with silver (Ag) having silver sulfide ($AgS_x$) as corrosion product. It should be noted that copper/silver, sulfur and their reaction products should be understood only as representative examples of reaction partners and reaction product, respectively, of a chemical reaction giving rise to the corrosion phenomenon, and not as the only and exclusive reaction partners, reaction product and corrosion phenomenon, respectively. Examples of materials and bond wires, respectively, which may be expected to be affected by the corrosion phenomenon include Cu-wire, palladium (Pd)-coated Cu wire, Au/Pd-coated Cu wire, Pd-doped Cu wire, Cu-wire doped with other noble metals, Ag-wire, doped Ag-wires, and coated Ag-wires. Similar corrosion reactions may occur with various other elements listed in the group VI (or 16) of the periodic table of elements (e.g. oxygen, sulfur, selenium, tellurium). A presence of more than one of these elements may aggravate the corrosion phenomenon.

The term "effective concentration" (e.g. of a compound, atoms, molecules, etc.) as used herein refers to a concentration of only a portion (of, e.g., the compound, the atoms, the molecules, etc.) that is available, e.g. chemically reactive, for causing the described corrosive effect on the metal surfaces of the package.

Many of the examples herein describe, as a metal contact structure electrically contacting the chip, a wire contacting both, the chip and a leadframe. The wire and the leadframe are to be understood as representative examples of any kind of suitable metal contact structure (also referred to as interconnect) that may be prone to the corrosion phenomenon described herein, e.g. metal contact structures including or consisting of copper and/or silver, with or without a noble metal coating. The metal contact structure may for example include or consist of a lead frame, a bond wire, an interconnect that may provide an electrical contact between a chip and a package substrate, between multiple chips, or between the chip and other materials. Such interconnects may for example include bumps and micro-bumps, pillars, clips, springs, metal fillings in e.g. "through encapsulation" or "through mold compounds" or "through silicon" vias or other interconnects for 3-dimensional or vertical connection, metal layers on or in a (e.g. polymer) substrate of the package, chip top front side metallization, redistribution layers, and/or a chip backside metallization.

Furthermore, other metal surfaces (including or consisting of the metals that may be prone to the corrosion, e.g. copper or silver) arranged in the package may be prone to the corrosion effect, for example passive components (e.g. inductors, capacitors, resistors), either on the chip or in the package, and other surfaces and components that may get in contact with the harmful components.

Thus, leadframes, pads and other metal surfaces shown here are to be understood as representative examples. The corrosion reaction may also take place on other surfaces (e.g. metal surfaces) and interfaces (e.g. metal-packaging material interface) not explicitly shown.

Furthermore, the Cu wedge bond interconnects may show weak bonding and adhesion, especially on surfaces which are coated with noble metals (e.g. gold (Au), silver (Ag), or palladium (Pd)) and which have a smooth, not roughened surface.

In general, conventional Cu bond interconnects may often and more easily (e.g. more easily than interconnects using gold wire) undergo corrosion in stress tests using moisture levels.

In order to overcome these problems, bond wire manufacturers are offering e.g. Cu wires that may be coated with noble metals like Pd, Pt or Au or Pd and Au or which may be doped with such noble metals. Similarly, Ag wires with noble metal coating or doping may offered. It had been expected that such noble metal coatings and dopings significantly reduce the oxidation and corrosion issues mentioned above. A typical example of such a coated wire $110a$ is shown in FIG. 2B. The coated wire $110a$ may include a core $110a0$, which may for example include or consist of copper, a diffusion layer $110a1$, which may include or consist of copper-palladium Cu—Pd, a palladium layer $110a2$, and a gold-palladium layer $110a3$.

However, it was found out that the noble metal coatings and dopings of Cu or Ag wires and other new or modified materials may significantly (maybe even exclusively) contribute to a new corrosion problem explained in more detail below.

The problem has only been observed recently, and no solution appears to have been found so far. Reasons why the problem has not been observed in the past may include that mainly Au-wire has been used in the past, with Cu-wire (and particularly various new flavors of doped and coated Cu or other wire) having been introduced only recently, that new materials and surfaces have been introduced into electronic packages only recently, that changes to composition of molding compounds and other package materials have been made by suppliers only recently (e.g. adjustment of molding compound to improve an adhesion to new leadframe surfaces like Pd Au or AuAg), and that devices are used in new and more aggressive applications only recently (e.g. operation at temperatures of 150° C. and above for extended duration (e.g. 1000 hours and well above), or in ambient conditions which contain corrosive components (e.g. exhaust gases)), or recent applications in automotive and industrial market that call for operation over periods of 45000 h in total (trucks) or for operation at 70° C. for 70000 h in hybrid e-vehicle applications.

Bond wires of certain type (e.g. Cu-wire, Pd-coated Cu wire, Au/Pd-coated Cu wire, Pd-doped Cu wire, Cu-wire doped with other noble metals, Ag-wire, doped Ag-wires, coated Ag-wires, etc.) in packaged products may be attacked and corroded during operation or storage at elevated temperatures or during HTS tests or after stress combinations like moisture followed by high temperature stress, e.g. UHAST 48 h+HTGS at 175° C.

The corrosion may lead to a weakening or loss of bond adhesion at a $1^{st}$ and $2^{nd}$ bond (e.g. nailhead to pad, wedge to leadframe or substrate), and/or to a weakening of the mechanical strength of the wire due to material loss or structural change.

The corrosion may further lead to an electrical fail of the interconnect and of the device during operation before an anticipated end of life is reached. Core wire material has been observed to creep along the noble metal coating of the wire and to cover the whole wire. Additionally, core wire material has been observed to form dendrites into the molding compound under certain conditions.

According to analytical investigations, a root cause for corrosion of the mentioned wire materials may be an attack of e.g. Cu metal by e.g. sulfur containing components, leading to the formation of e.g. $CuS_x$ compounds. This corrosion reaction may especially be observed at a periphery of the $1^{st}$ bond or the $2^{nd}$ bond, an interface of the $1^{st}$ bond and of the $2^{nd}$ bond (e.g. to pad, leadframe or substrate), and/or within a wire loop (creation of pittings behind small defects in the coating)

Figure 1B:
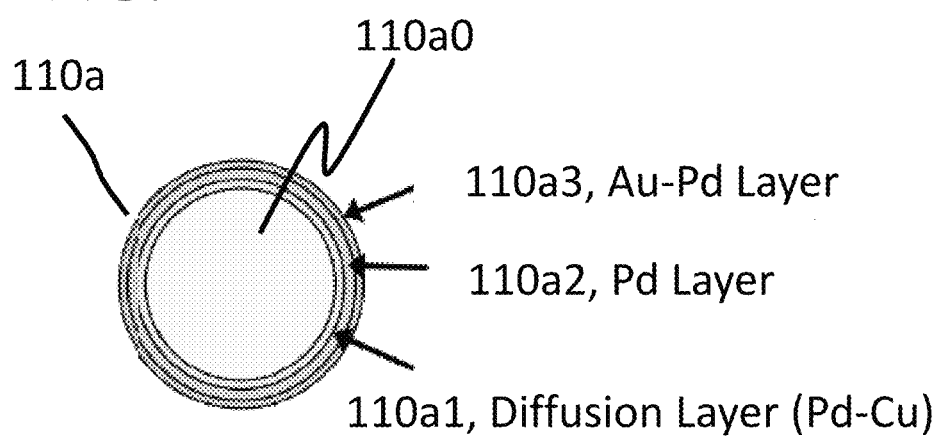
FIG. 1B shows a cross sectional view of a bond wire.

FIG. 1A shows a cross sectional view of a chip package 100, and FIG. 1B shows a cross sectional view of a bond wire $110a$.

Figure 2:
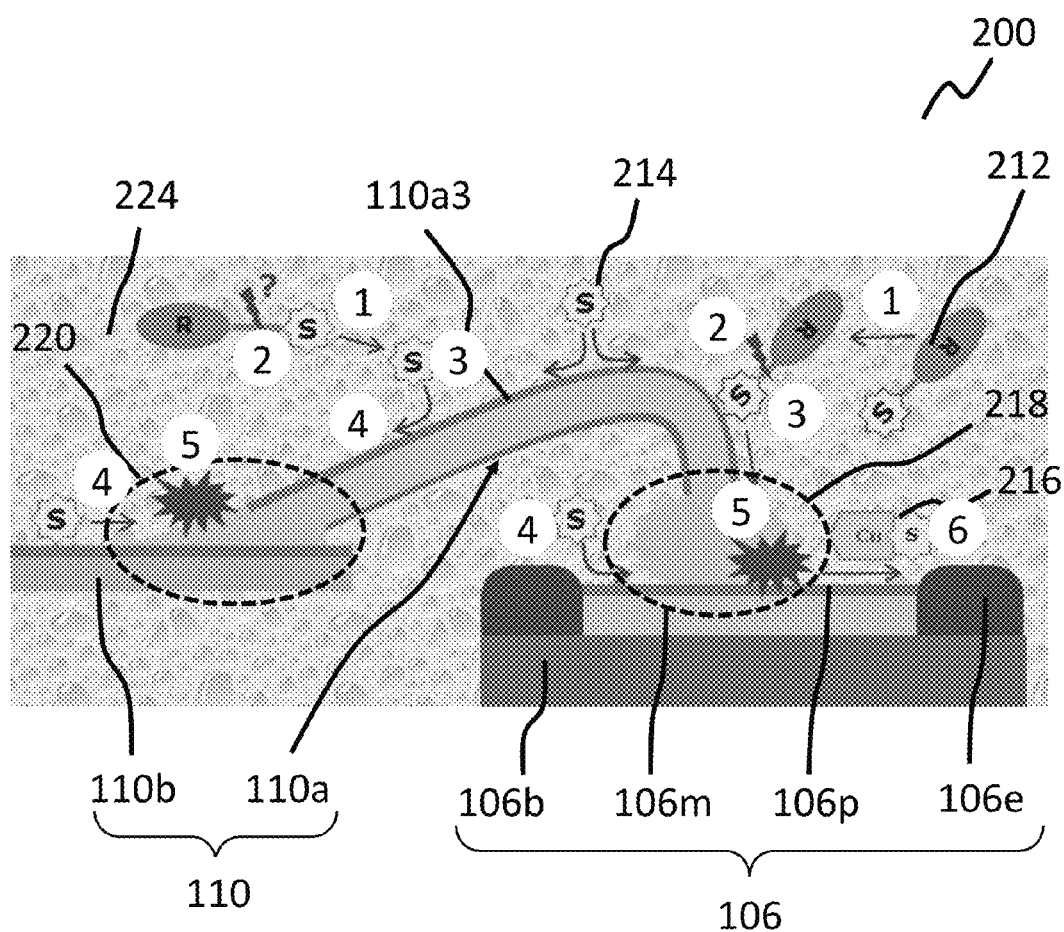
FIGS. 2 shows a schematic cross section visualizing a corrosion process on metal surfaces in a chip package.

FIG. 2 shows a schematic cross section 200 visualizing a corrosion process on metal surfaces in a chip package.

The chip package may include a chip 106. The chip 106 may include a chip base $106b$, which may for example include or consist of a semiconductor material, e.g. silicon. The chip 106 may further include a chip metal surface $106m$, which may be protected by a cap layer $106p$. The chip 106 may further include a chip edge region $106e$.

The chip package may further include a metal contact structure 110, which may be electrically contacting the chip 106 (at the chip metal $106m$). The metal contact structure 110 may include a wire $110a$, which may be the portion of the metal contact structure 110 that may be electrically and physically contacting the chip 106 in a contact region 218. The electrically conductive contact may be formed as a so-called nailhead contact (due to a nailhead shape of the contacting end of the wire 110a). The wire 110a may be identical or similar to the wire 110a shown in FIG. 1A and FIG. 1B.

The metal contact structure 110 may further include a portion 110b. The portion 110b of the metal contact structure may provide an electrically conductive connection between the wire 110a and an outside of the package. An electrically conductive contact between the wire 110a and the portion 110b of the metal contact structure 110 may be wedge-shaped (the wedge shape may be caused by a pressure applied during a contacting process). In various embodiments, for avoiding an oxidation of the portion 110b of the metal contact structure 110, a top layer 110bm may be arranged on a top surface of the portion 110b, i.e. on the surface of the portion 110b where the electrically conductive contact between the wire 110a and the portion 110b is formed. The top layer 110bm may for example include or consist of Pd, Au, SiN, SiCN, $Al_2O_3$. The top layer 110bm may be a thin layer, e.g. with a thickness of up to 20 nm.

The chip package may further include packaging material 224, also referred to as molding compound. The packaging material 224 may for example include a resin or any other suitable dielectric packaging material 224 that may be used for being molded at least partially around the chip 106 and the metal contact structure 110. The packaging material 224 may at least partially encapsulate the chip 106 and the metal contact structure 110. The packaging material 224 may be in physical contact with surfaces, e.g. metal surfaces, of the chip 106 and/or of the metal contact structure 110. The packaging material 224 may for example be molded around the chip 106 and the metal contact structure 110. The chip and the metal contact structure may for example be completely encapsulated by the packaging material 224, wherein only ends of the metal contact structure 110, and optionally a back side of the chip 106, free from the encapsulation material 224 for providing an electrically conductive connection between the chip 106 and an outside of the chip package.

It has been observed that packaged products, for example metal surfaces in the chip package 100, e.g. the metal surface 106m of the chip 106 and/or of the metal contact structure 110 electrically contacting the chip 106, may be attacked and corroded during operation or storage at elevated temperatures or during high temperature storage (HTS) tests. A detrimental impact of other factors (e.g. humidity, bias, etc.) may not be excluded. Furthermore, the corrosion reaction may not be limited to high temperatures (e.g. ≥150° C.). It is observed to occur at significantly lower temperatures, even down to room temperature.

A rate of the reaction may depend on several parameters like concentrations of various species, temperature, texture and composition of metals, moisture level, etc, and thus an impact on operating lifetime of devices may be much more detrimental than initially observed in purely thermally accelerated investigations.

The corrosion may lead to a weakening or loss of adhesion at a $1^{st}$ bond (which may for example be a bond of a so-called "nailhead" of the wire 110a to the chip 106, e.g. to a metal surface 106m of the chip 106, which may also be referred to as a pad, a bond pad, or a metal pad) and/or at a $2^{nd}$ bond (which may for example be a bond of a so-called "wedge" (e.g. a pressed, and thus wedge-shaped end of the wire 110a) to the second portion 110b of the metal contact structure 110, e.g. a leadframe or a substrate). The corrosion may lead to an electrical fail of an interconnect and of a device, e.g. the chip package, during operation before an anticipated end of life is reached. Thus, a reliability of the device, e.g. the chip package, may be decreased.

Corrosion phenomena that have been observed in chip packages may have been caused by elements listed in group VI of the periodic table of elements, e.g. oxygen, sulfur, selenium, tellurium. In these observed examples, a location of the corrosion mainly focused on the bond wire 110a and its interfaces to e.g. the bond pad (on a top surface of the chip 106) or to the lead frame 110b.

However, the corrosion may also occur on any other surface or material that may be prone to the corrosion reaction described below or may be attacked by components containing the above mentioned harmful elements. A risk of corrosion may increase especially if the respective surface or material (e.g. metal surface or material) is in direct contact with the harmful component.

As an example, a corrosion attack on the nailhead of the wire 110a, on the metal bond pad 106m of the chip 106, and on the wedge end of the wire 110a is shown in FIG. 2.

In this example, the bond pad 106m may mainly include copper (Cu) metal. However, the corrosion may readily occur if the bond pad 106m mainly consists of any of the above mentioned metals that are prone to be attacked, of which the copper (Cu) is one example, and if the top surface of the pad 106m is not protected.

Corrosion may, however, also occur if the pad 106m has been protected by a thin (e.g. thinner than 20 nm) cap layer 106p of e.g. Pd, Au, SiN, SiCN, $Al_2O_3$ or others. Such a cap layer 106p may be used to avoid an oxidation of the (Cu) pad 106m in an ambient environment after finishing a wafer production process. However, such a cap layer 106p may be (intentionally or unintentionally) disturbed by an impact of a bonding process in order to achieve a good mechanical and electrical contact once the singulated chips 106 are going to be packaged. At the disturbed locations 330a, 330b, exposed core material 110a0 may be prone to the corrosive attack.

The corrosion may continuously be ongoing (especially at elevated temperatures that may for example be caused by device operation or ambient temperature) and may finally lead to a disruption of the mechanical and electrical contact and to a functional failure of the device.

The corrosion reaction may not be restricted to occur only with surfaces or materials which mainly consist of Cu metal, but may also occur with surfaces or materials as described above and which might be attacked by components containing harmful elements.

Furthermore, the corrosion reaction may not be restricted to occur at the chip pad 106m. In general, surfaces or package components that may be prone to the corrosion phenomenon may include bond or contact pads 106m (either with initial cap layer 106p or without), the portion 110b of the metal contact structure 110, e.g. lead frames, or other substrate materials containing the above mentioned metals, other interconnects than bond wires that may provide an electrical contact between a chip and a package substrate, between multiple chips, or between chip and other materials, which may include the metal contact structure 110 and other metal contact structures. Such interconnects may include bumps and micro-bumps, pillars, clips, springs, metal fillings in e.g. "through encapsulation" or "through mold compounds" or "through silicon" vias or other interconnects for 3-dimensional or vertical connection, metal layers on or in a (e.g. polymer) substrate of the package, chip top front side metallization, redistribution layers, chip backside metallization, passive components (e.g. inductors, capacitors, resistors), either on the chip or in the package, and other surfaces and components that may get in contact with the harmful components.

A model for a mechanism of the corrosion reaction is described below. A sequence of processes of the mechanism explaining transport kinetics and a degradation mechanism is schematically shown in FIG. 2 for an exemplary case of a palladium (Pd)-coated copper (Cu) wire in combination with sulfur species. The model may similarly apply to other materials and material combinations as described herein. The individual processes of the multi-step process are labelled by figures from 1 to 6.

In the example shown in FIG. 2, the nailhead in the first contact region 218, also referred to as bond region 218, and the pad 106m basically consist of the same element (e.g. Cu). Therefore, a galvanic element is not likely to form, and the mechanism of the corrosion may be different from those typically observed and described in the literature (e.g. corrosion in humid atmosphere, formation of local or galvanic elements, corrosion via formation of ions, are not likely to occur in this case).

Sulfur containing material, e.g. sulfur containing molecules 212 in the packaging material 224 (either made available intentionally or as contamination), may diffuse through the packaging material 224 (the molding compound) (marked with 1).

The sulfur-containing molecules 212 may easily and catalytically be decomposed (marked with 2) to a large extent, e.g. even at low temperatures, leading to smaller S-containing fragments 214 that may be strongly adsorbed onto the noble metal surfaces, e.g. Pd-surfaces, e.g. the coating 110a3 of the wire 110a (marked with 3).

The decomposition products (adsorbed S-containing fragments 214) may easily and rapidly diffuse along the noble metal surfaces, e.g. the palladium (Pd) surface (marked with 4).

Whenever they reach unprotected Cu (or Ag) metal, the adsorbed 5-containing fragments (also referred to as S-containing species) 214 may react irreversibly with the unprotected metal, e.g. the unprotected Cu- or Ag-wire, to form copper sulfide $CuS_x$ 216 or silver sulfide $AgS_x$, respectively (marked with 5). Unprotected Cu may mainly, or even only, be available at a location of the $1^{st}$ bond 218 and of the $2^{nd}$ bond 220 due to the bonding process, e.g. a FAB (free air ball) process or a wedge process. Therefore, these interconnect regions 218, 220 may degrade rapidly, which may lead to mechanically weak interconnects and to electrical failures.

The reaction products 216 (e.g. $CuS_x$ or $AgS_x$) may migrate easily along surfaces and interfaces due to creep corrosion (marked with 6). Especially sulfides of noble or semi-noble metals (e.g. Ag, Cu) may be prone to creep corrosion on surfaces of noble metals (e.g. Au, Pd) and on surfaces of organic materials (e.g. polyimide, mold resin). Therefore, no self-passivation but rapid corrosion of such metal interconnects may take place.

The corrosion reaction may be catalyzed or enhanced by the presence of the noble metals such as e.g. Pd, Pt, Au, and/or by alloys, by intermetallic compounds or by solid solutions of such noble metals, or by other intermetallic compounds like e.g. $AlCu_x$.

A root cause of the corrosion may thus be an attack of metal, e.g. Cu or Ag, by e.g. sulfur containing components (or chemically similar materials from group VI of the periodic table of elements, like e.g. O, Se, Te), leading to the formation of e.g. $CuS_x$ compounds. This corrosion reaction may be especially observed at a periphery of the $1^{st}$ bond and/or the $2^{nd}$ bond, interfaces of the $1^{st}$ and $2^{nd}$ bond (e.g. to pad, leadframe or substrate).

A source of the corrosive agent sulfur (or chemically similar materials as mentioned herein, e.g. other group VI elements, e.g. oxygen, sulphur, selenium, and/or tellurium) may for example include or consist of components of the packaging material (the molding compound) 224, in which the chip 106 and the metal contact structure 110 may at least partially be encapsulated. The components of the molding compound 224 acting as the source of the corrosive agent (e.g. the elements sulfur (S) and/or selenium (Se) and/or tellurium (Te), and other elements which might cause the corrosion reaction) may for example be a resin material of the molding compound, e.g. a resin polymer, which may be forming a polymer network after a curing process, a filler material like a solid inorganic material that may be used to fill and stiffen the package, an adhesion promoter for providing or improving an adhesion between different materials or interfaces, a solvent or other component supplied or used with the materials used in the packaging process, a colouring material, e.g. carbon black, etc., a chip coating like polyimide, a contamination contained in the molding compound and its ingredients. Other sources of the corrosive agent may be or include other components within the package, e.g. a glue for a die attach or any other attachment process, a contamination contained therein, and/or one or more components or contamination of the ambient (e.g. $H_2S$, $SO_2$, elementary sulfur, etc.), or any other source introducing the corrosive agent(s) by any process of the packaging.

An overall reaction rate may be influenced by further additives and contaminations. For example, ion catchers (e.g. $Cl^-$, $OH^-$) may be present in the mold compound, and/or moisture may be present at or near reaction sites. The corrosion reaction may not be limited to high temperatures (e.g. ≥150° C.), but may be observed to occur even at significantly lower temperatures, down to room temperature. Furthermore, the rate of the corrosion reaction may depend on several parameters like concentration of various species, temperature, texture and composition of metals, moisture level, electrical bias etc., and thus impact on operating lifetime of devices can be much more detrimental than initially observed in purely thermally accelerated investigations. Thus, for the intrinsic degradation mechanism, several further influencing factors may have to be expected in package and product environment, leading to a varying extent of degradation that may be difficult to predict and/or control.

While the noble metal coating 110a3 may protect the copper core 110a0 of the wire 110a in most regions, it may catalyze a chemical reaction with the sulfur in regions where the copper is not protected, for example in the contact regions 218, 220.

A transport of adsorbed species 214 along the noble metal surfaces, for example along the wire with the coating 110a3, may be very fast.

The reaction products 216 may be prone to creep corrosion, therefore voluminous voids may grow.

According to our investigations and research work, the mentioned degradation or corrosion may be caused to a non-negligible extent by certain materials or compounds that may be used in the assembly and packaging process. In particular, the corrosion may be caused —amongst others— by materials like organic thiols and derivates of the type R—X—R", organic sulfides and derivates of the type R—$(X)_n$—R', sulfur containing heterocycles or thiophenes with R=any organic root, either aliphatic (e.g. —$CH_3$, —$C_2H_5$, . . . ) or aromatic (e.g. -phenyl or other aromatic root), R'=—H or any organic root, either aliphatic (e.g. —CH$_3$, —C$_2$H$_5$, ...) or aromatic (e.g. -phenyl or other aromatic root), R"=H, X being S, Se, or Te, and n≥2.

Such compounds may be used in certain materials or process steps in order to e.g. foster or improve the adhesion between metal surfaces and polymer materials. However, in the presence of noble metals like Pd, Pt, Au, the organic thiols and sulfides may tend to decompose at relatively low temperatures (<200° C.) and attack metals which may be in use as, e.g., core bond wire materials (e.g. Cu, Ag), thereby forming e.g. CuS$_x$ or AgS$_x$.

Simply removing or not using such materials in a bill of materials (BoM) of a packaged device may help to reduce or avoid the corrosion degradation. On the other hand, other detrimental issues like delamination or weak adhesion of e.g. organic materials to metal surfaces may be an unwanted consequence and may limit or negatively impact a lifetime of the device under operational conditions.

In various embodiments, the described degradation or corrosion is avoided or significantly reduced by significantly reducing the absolute or the effective concentration of any materials, compounds, or elements in the assembly and packaging process that are known to cause the corrosion.

In various embodiments, no materials or compounds that contain the elements sulfur (S) and/or selenium (Se) and/or tellurium (Te) in any modification and in any remarkable concentration may be used in an assembly and packaging process.

In various embodiments, an effective concentration of materials that are known to cause the corrosion may be reduced. An advantage of this approach may be that any kind of bond wire (e.g. even with copper and silver or alloys or other mixtures thereof as core wire material) and with any kind of coating or doping (e.g. even with noble metal coating such as Pd, Au, Pt or alloys or other mixtures thereof) may be used without running into the corrosion issue. Therefore, the mentioned benefits and advantages of such bond wires can be made use of. In addition, the embodiments allow the use of other metallic package components like e.g. metal contact structures (e.g. leadframes), substrates, or bond pads (e.g. chip metal surfaces) without risking that these leadframes, substrate materials, pads and other components may also be corroded or may be enhancing or catalyzing the corrosion reaction.

In various embodiments, it may be an advantage that the bond wire, especially sections of the bond wire where the core wire material may be exposed after electrically contacting the chip with the metal contact structure (e.g. where the metal contact structure may electrically and physically contact the chip, e.g. in the first contact region 218 (also referred to as 1$^{st}$ bond region or interconnect region), and/or within the metal contact structure, for example at a second contact region 220 (also referred to as 2$^{nd}$ bond, e.g. between a wire and a leadframe), may not need to be protected by any means or process after the bond interconnect has been formed and before the package is molded.

In various embodiments, for avoiding the described corrosion reaction completely, a total absolute content of the mentioned individual elements in the package may be less than 1 atomic part per million (written as 1 at ppm).

In various embodiments, in order to reduce the described corrosion reaction to a certain extent that still might be tolerated for certain applications of electronic devices, a total absolute content of the mentioned individual elements in a package may be less than 5 at-ppm, or less than 10 at-ppm.

In various embodiments, the mentioned materials may be free of or may include less than 10 at-ppm (in sum) of one or more of the following compounds: organic thiols and derivates of the type R—X—R' with R and/or R'=—H or any organic root (also referred to as residual), either aliphatic (e.g. —CH$_3$, —C$_2$H$_5$, ...), aromatic (e.g. -phenyl or other aromatic root based on either pure hydrocarbons or with one or more heteroatoms like N, P, ...) and X being S, or Se, or Te, organic sulfides and derivates of the type R—(X)$_n$—R' with R and/or R'=—H, or any organic root, either aliphatic (e.g. —CH$_3$, —C$_2$H$_5$, ...), aromatic (e.g. -phenyl or other aromatic root based on either pure hydrocarbons or with one or more heteroatoms like N, P, ...) and X being S, or Se, or Te, and n being ≥2, and any organic heterocycles containing one or more sulfur, selenium and/or telurium atoms per molecule.

In various embodiments, the mentioned elements sulfur (S) and/or selenium (Se) and/or tellurium (Te), and/or other elements that may cause the corrosion reaction may be included in a bill of materials, e.g. as part of one or more of the compounds described above, to a certain higher content, e.g. at a concentration of above 10 at ppm. However, the bill of materials may then include in addition inorganic or organic compounds that may irreversibly react with the elements sulfur (S) and/or selenium (Se) and/or tellurium (Te) and other elements that may cause the corrosion. As a consequence, an effective concentration of the elements may be lowered to an uncritical or at least less critical level, and thus the corrosive attack to the metal surfaces (e.g. to the wire and/or the metal interconnects) may be significantly reduced. Examples for organic substances that may readily couple or react with e.g. sulfur containing groups are maleimides, bismaleimides and other derivates of aminoacids and other compounds.

For example, the element sulfur that may be causing the corrosion reaction may be contained in the molding compound as an organic thiol compound with a functional group R-S-H. Such thiols are known for their high reactivity with certain metals (Pd, Cu, Ag, ...), leading to metal sulfide formation and to ongoing corrosion due to creep effects. However, an effective concentration of the compounds containing thiol groups may be reduced by offering e.g. polarized organic molecules like methyl iodide (CH$_3$I), ethyl iodide (C$_2$H$_5$I), mesylate (R—SO$_3$—CH$_3$), triflate (R—SO$_3$—CF$_3$) and/or tosylate (R—SO$_3$—C$_6$H$_4$—CH$_3$). Such molecules may be readily attacked by the nucleophilic thiol group in order to form organic sulfides of the type R—S—R'. Such organic sulfides may have a lower tendency to attack metals and to form metal-sulfides, and thus a lower corrosive power, than compounds with thiol groups. On the other hand, the high reactivity of e.g sulfur containing groups with heavy metals (e.g. Cu, Ag, Bi, Sn, Zn, Sb, ...) and their ions may be exploited to couple and bind them and to thereby reduce their effective concentration.

In various embodiments, the mentioned materials may be added to the packaging material (the molding compound) from the very beginning, in other words before the packaging material is arranged as part of the chip package.

In various embodiments, the mentioned materials may be added to the packaging material delayed, e.g. after the molding compound has already been supplied to the package. In this case, the compounds with the functional group R—S—H (thiol) may first link to relevant surfaces, e.g. metal surfaces, in the package (e.g. wire, chip metal surface, leadframe) and may provide or arrange for an excellent adhesion between the packaging material (e.g. a polymer) and the other surfaces (e.g. the metal surface). Afterwards, by adding molecules like $CH_3I$, excessive compounds with the functional group R—S—H (thiol) may react with the added $CH_3I$ and may be captured by forming organic sulfides. Thus, the effective concentration of compounds with the reactive functional group R—S—H (thiol) may be significantly reduced, leading to a lower risk for corrosion reaction.

In various embodiments, the inorganic or organic functional groups or components that may readily react with e.g. sulfur containing components may be fixed to other constituents of the molding compound, e.g. to filler particles. Filler particles (mainly based on $SiO_2$) may typically represent 50% or even more of the molding compound volume. Accordingly, they may provide a large area where appropriate coupling agents (either organic or inorganic) may be attached. Due to an effective coupling of components that contain sulfur (S) and/or selenium (Se) and/or tellurium (Te) and other elements that may cause the corrosion, the effective concentration of the corrosive components may be significantly reduced, leading to less corrosive attack of the metals.

In various embodiments, the coupling agents for the corrosive components may be attached to/provided in a resin network of the molding compound.

In various embodiments, the mentioned elements sulfur (S) and/or selenium (Se) and/or tellurium (Te) and/or other elements that may be known to cause the corrosion reaction may be contained in the bill of material to certain higher absolute concentrations. However, these elements may be included in compounds that may have additional other functional groups (e.g. amino-, azoles, silanols, carboxylic and/or other functional groups). These other functional groups may bond more strongly and preferably to metal surfaces (e.g. of a wire, a chip metal surface, a leadframe, and the like) than the e.g. sulfur containing functional group. The elements that may be known to cause the corrosion (S, and/or Se and/or Te and/or others) may then be hindered to react with the metal of the metallic surface(s) (e.g. of the wire, the chip metal surface, the leadframe, etc.) either due to steric reasons or due to a high degree of self-assembled coordination. Exemplary compounds may include two or more functional groups. Other examplary compounds may be sterically hindered organic compounds. Due to the steric hindrance and/or self-assembled coordination, the functional group that may contain e.g. sulfur may not be in close vicinity or direct contact with the metal surface. Accordingly, the catalytic decomposition into smaller, more reactive components may not be taking place, or at least to a much lower extent. Thus, attack and corrosion of the metal surface may not take place or may be significantly reduced. This may be due to the much lower effective concentration of the corrosive functional group at the respective metal surface.

In various embodiments, an effective concentration of the corrosive component with e.g. sulfur containing functional group may be reduced or minimized by "condensation" of monomers to oligomers or even polymers. This condensation may be initiated by adjusting or modifying a pH-value of the molding compound to either slightly acidic (pH=3-6) or slightly alkaline (pH=7-10) conditions. In contrast to especially short chain monomers, such oligomers and polymers may be thermodynamically much more stable and may not represent easy leaving groups. They may require significantly higher temperatures (>250° C.) in order to thermally decompose to smaller and more reactive (=corrosive) fragments. Such high temperatures may not be typically applied to microelectronic devices. Thus, attack and corrosion of the metal surface may not take place or may be significantly reduced, because the effective concentration of the corrosive fragment, the monomer, may be much lower.

In various embodiments, an effective concentration of the corrosive component with e.g. a sulfur containing functional group may be reduced or minimized by capping with e.g. compounds that tend to form large networks. One example for such a compound is TEOS (Tetraethylorthosilicate). Moderate thermal treatment may lead to condensation between the —C—Si—O—H endings to either —C—Si—O—Si—C— networks, or with e.g. sulfur containing functional groups to —C—Si—S—Si—C— networks. Due to the network formation, the effective concentration of the corrosive fragment may be significantly reduced.

According to various embodiments, the corrosive attack of bond wires and/or other metal surfaces in the chip package by aggressive sulfur-containing or other components may be either significantly reduced or completely avoided.

In various embodiments, a corrosion risk for bond wires and metal surfaces may be reduced or eliminated, even if the bond wire(s) and/or the metal surfaces may be coated with noble metals.

In various embodiments, processes of a method of forming a chip package may easily be integrated into a standard process flow as used in backend fabrication lines for microelectronic products. Other processes used in such fabrication lines like plasma treatment and/or wet treatment (e.g. for pre-cleaning or for roughening a surface) may also be applied.

Figure 3:
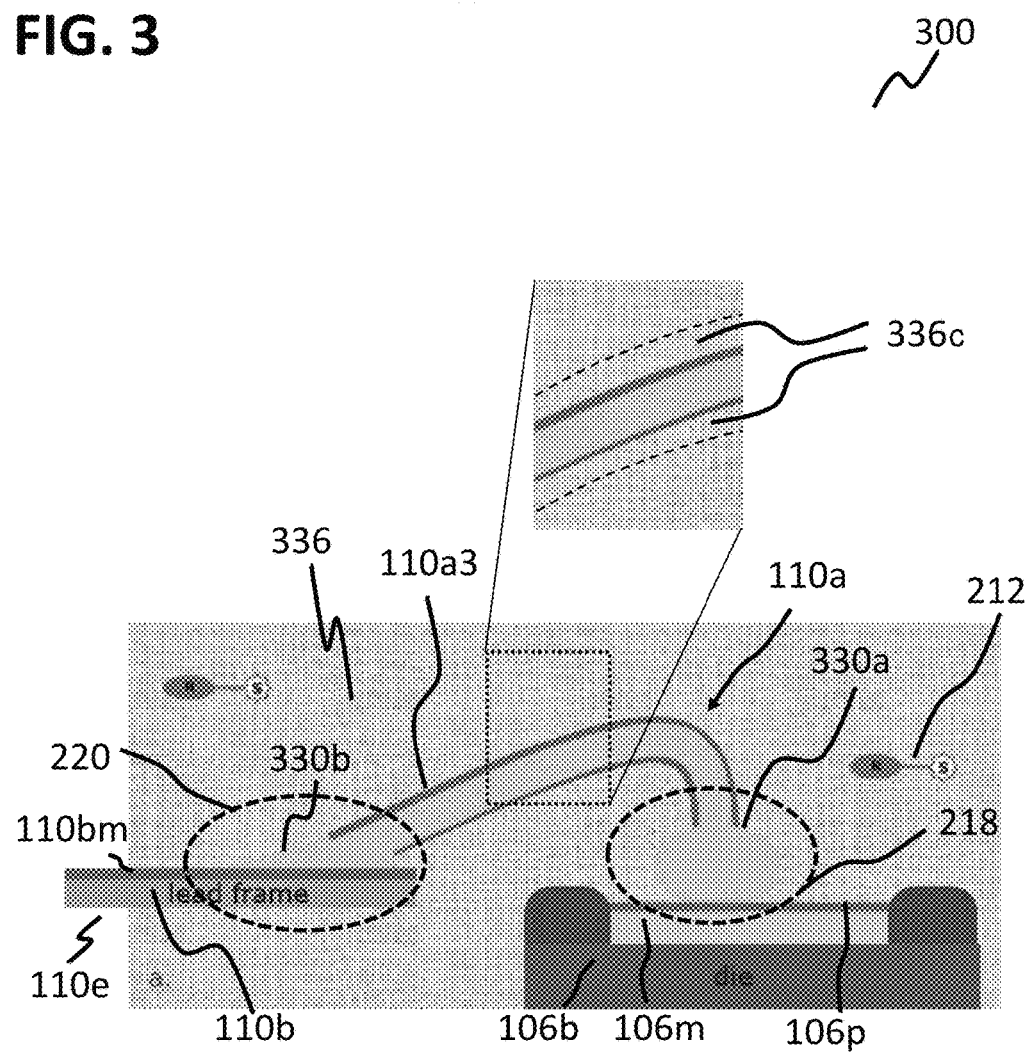
FIG. 3 shows a schematic cross section of a chip package according to various embodiments.

In various embodiments, as shown in FIG. 3 in a cross-sectional schematic view 300, a chip package may be provided.

The chip 106 and the metal contact structure 110 etc. of the chip package of FIG. 3 may be similar or identical to the chip 106 and the metal contact structure 110, etc., of FIG. 2, and their description is not repeated here.

However, a packaging material 336 may differ from the packaging material 224 of FIG. 2.

In various embodiments, the packaging material 336 (the molding compound) may be (essentially) free from molecules including sulfur, selenium or tellurium (exemplarily represented in FIG. 3 as sulfur containing molecules 212).

In various embodiments, the packaging material 336 may be in a liquid state when it is arranged as part of the chip package. The packaging material 336 may for example be molten, or it may include a solvent. After the arranging the packaging material 336, the packaging material 336 may solidify, for example by curing, e.g. by cooling down, by irradiating with UV light, by evaporation of the solvent, or by any other technique known in the art. The packaging material 336 may be arranged to at least partially, for example completely, encapsulate the chip 106. The packaging material 336 may further at least partially encapsulate the metal contact structure 110. For example a contact region 218, in which the metal contact structure 110 may form an electrically conductive contact with the chip 106, e.g. with the chip metal surface 106*m*, may be encapsulated by the packaging material 336. An external contacting portion 110*e* of the metal contact structure 110 may remain free from the packaging material 336 for electrically contacting the chip 106 from an outside of the chip package.

In various embodiments, for example in a case as shown in FIG. 3, of the metal contact structure 110 including a plurality of individual parts, e.g. the wire 110*a* and the leadframe 110*b*, the contact region 220 between the individual parts, e.g. between the wire 110a and the leadframe 110b, may also be encapsulated by the packaging material 336.

In various embodiments, the chip package may include a plurality of interface regions between a metal surface and the packaging material 336, for example between the chip metal surface 106m (shown in FIG. 3 is a front side chip metal surface; however, in a case of a chip back side opposite the chip front side or a chip side surface also being at least partially encapsulated by the packaging material 336 and including metal, the same may also apply to these surfaces) and the packaging material 336, between the metal contact structure 110, e.g. disturbed portions 330a and/or 330b, a wire, a lead frame, or any other variety of metal contact structure 110 as described above, and the packaging material 336, and/or between any other metal structure at least partially embedded in the packaging material 336. Herein, the metal surface may include or consist of any metal that is suitable for forming a metal surface included in a chip package, including noble metals.

In various embodiments, the packaging material 336 may include a contact layer 336c being in physical contact with the chip metal surface 106m, 106p and/or with the metal contact structure 110. In FIG. 3, a portion of the contact layer 336c that is in physical contact with the wire 110a is shown in the zoom window. However, the contact layer 336c may be formed along all metal surfaces of the chip package. At least in the contact layer of 336c of the packaging material 336, a summed concentration of chemically reactive sulfur, chemically reactive selenium and chemically reactive tellurium is less than 10 atomic parts per million. In other words, adding the atomic concentration of chemically reactive sulfur in the contact layer 336c to the atomic concentration of chemically reactive selenium in the contact layer 336c and to the atomic concentration of chemically reactive tellurium in the contact layer 336c, the sum is smaller than 10 atomic parts per million.

In various embodiments, in the packaging material 336 as a whole, a summed concentration of chemically reactive sulfur, chemically reactive selenium and chemically reactive tellurium may be less than 10 atomic parts per million. In various embodiments, no materials or compounds that contain the elements sulfur (S) and/or selenium (Se) and/or tellurium (Te) in any modification and in any remarkable concentration may be used in the packaging material.

Thus, in various embodiments, by significantly reducing an absolute concentration of any materials, compounds, or elements in the packaging material 336, or at least in the contact layer 336c of the packaging material 336, that are known to cause the corrosion, the described degradation or corrosion may be avoided or significantly reduced.

In various embodiments, the absolute concentration of materials that are known to cause the corrosion may be reduced. An advantage of this approach may be that any kind of metal, e.g. metal contact structure 110, e.g. bond wire 110a (e.g. even with copper and silver or alloys or other mixtures thereof as core wire material) and with any kind of coating or doping (e.g. even with noble metal coating such as Pd, Au, Pt or alloys or other mixtures thereof), may be used without running into the corrosion issue. Therefore, the mentioned benefits and advantages of such metal, e.g. metal contact structures 110, e.g. bond wires 110a, other metallic package components like e.g. other metal contact structures 110 (e.g. leadframes 110b), substrates, or bond pads (e.g. chip metal surfaces 106m) can be made use of, without risking that these leadframes, substrate materials, pads, and other components may also be corroded or may be enhancing or catalyzing the corrosion reaction.

In various embodiments, it may be an advantage that the bond wire 110a, especially sections of the bond wire where the core wire material 110a0 may be exposed after electrically contacting the chip 106 with the metal contact structure 110 (e.g. where the metal contact structure 110 may electrically and physically contact the chip 106, e.g. in the first contact region 218 (also referred to as $1^{st}$ bond region or interconnect region), and/or within the metal contact structure 110, for example at a second contact region 220 (also referred to as $2^{nd}$ bond region, e.g. between the wire 110a and the leadframe 110b), may not need to be protected by any means or process after the bond interconnect has been formed and before the package is molded.

In various embodiments, for avoiding the described corrosion reaction completely, a total absolute content of the mentioned individual elements (S, Se, Te) in the contact layer 336c of the packaging material 336, in the packaging material 336 as a whole, or in the package as a whole, may be less than 1 atomic part per million (written as 1 at ppm).

In various embodiments, in order to reduce the described corrosion reaction to a certain extent that still might be tolerated for certain applications of electronic devices, a total absolute content of the mentioned individual elements (S, Se, Te) in the contact layer 336c of the packaging material 336, in the packaging material 336 as a whole, or in the package as a whole, may be less than 5 at-ppm, or less than 10 at-ppm.

In various embodiments, the mentioned materials, e.g. the contact layer 336c of the packaging material 336, or the packaging material 336 as a whole, may be free of one or more of the following compounds: organic thiols and derivates of the type R—X—R' with R and/or R'=—H or any organic root (also referred to as residual), either aliphatic (e.g. —CH$_3$, —C$_2$H$_5$, . . . ), aromatic (e.g. -phenyl or other aromatic root based on either pure hydrocarbons or with one or more heteroatoms like N, P, . . . ) and X being S, or Se, or Te, organic sulfides and derivates of the type R—(X)$_n$—R' with R and/or R'=—H, or any organic root, either aliphatic (e.g. —CH$_3$, —C$_2$H$_5$, . . . ), aromatic (e.g. -phenyl or other aromatic root based on either pure hydrocarbons or with one or more heteroatoms like N, P, . . . ) and X being S, or Se, or Te, and n being ≥2, and any organic heterocycles containing one or more sulfur, selenium and/or telurium atoms per molecule. In various embodiments, the mentioned materials, e.g. the contact layer 336c of the packaging material 336, or the packaging material 336 as a whole, may be essentially or completely free of all of these compounds.

In various embodiments, the listed compounds may be present in the contact layer 336c of the packaging material only in a concentration corresponding to a concentration of the S, Se and/or Te-atoms included in the compounds of less than 10 at ppm, e.g. less than 5 at ppm, e.g. less than 1 at ppm.

In various embodiments, the listed compounds may be present in the packaging material 336 only in a concentration corresponding to a concentration of the S, Se and/or Te-atoms included in the compounds of less than 10 at ppm, e.g. less than 5 at ppm, e.g. less than 1 at ppm.

In various embodiments, the listed compounds may be present in the package only in a concentration corresponding to a concentration of the S, Se and/or Te-atoms included in the compounds of less than 10 at ppm, e.g. less than 5 at ppm, e.g. less than 1 at ppm.

Figure 4A:
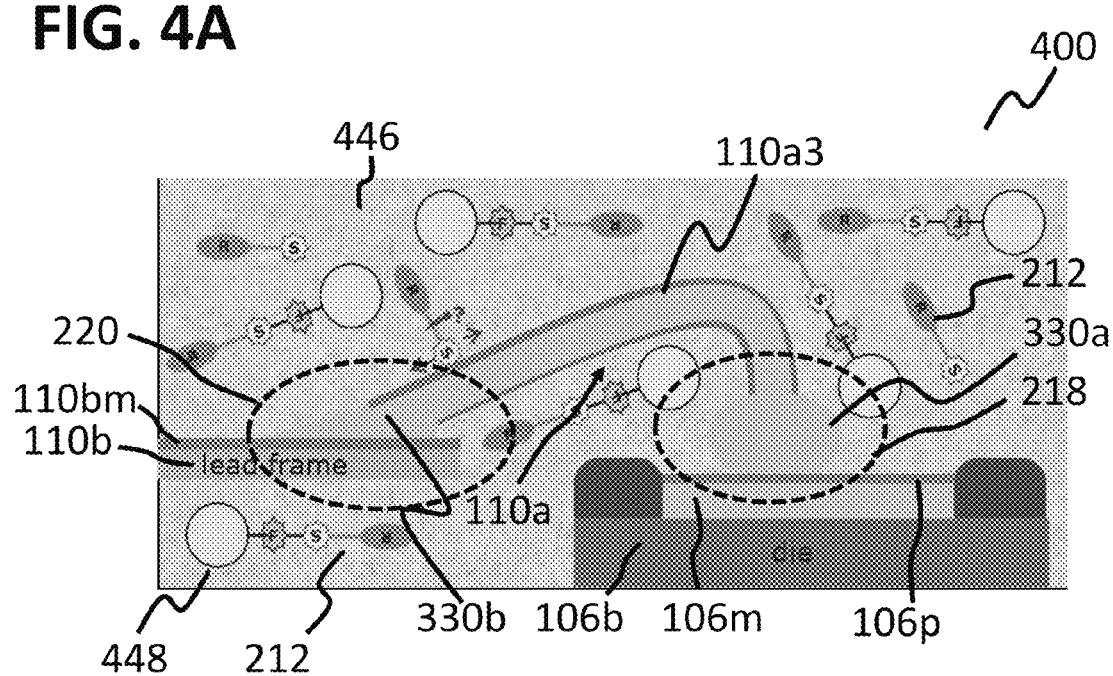
FIG. 4A shows a schematic cross section of a chip package according to various embodiments.

In various embodiments, as shown in FIG. 4A in a cross-sectional schematic view 400, a chip package may be provided.

The chip 106 and the metal contact structure 110 etc. of the chip package of FIG. 4A may be similar or identical to the chip 106 and the metal contact structure 110, etc., of FIG. 2 and FIG. 3, and their description is not repeated here.

However, a packaging material 446 may differ from the packaging material 224 of FIG. 2 and from the packaging material 336 of FIG. 3.

Figure 4B:
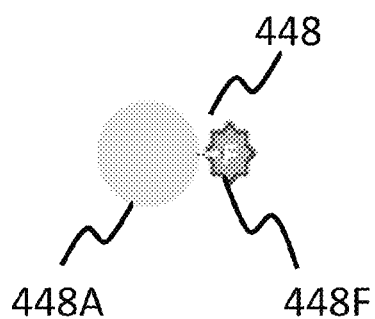
FIG. 4B shows a component of a packaging material of a chip package according to various embodiments.

In various embodiments, as shown in FIG. 4A and FIG. 4B, the described degradation or corrosion may be avoided or significantly reduced by significantly reducing an effective concentration of any materials, compounds, or elements in the assembly and packaging process that are known to cause the corrosion.

In various embodiments, the mentioned elements sulfur (S) and/or selenium (Se) and/or tellurium (Te), and/or other elements that may cause the corrosion reaction (as an example, sulfur-containing molecules 212 are shown in FIG. 4A) may be included in a bill of materials, e.g. as part of one or more of the compounds described above, to a certain higher content, e.g. at a concentration of above 10 at ppm. However, the bill of materials may then include in addition inorganic or organic compounds 448 that may irreversibly react with the elements sulfur (S) and/or selenium (Se) and/or tellurium (Te) and other elements that may cause the corrosion. As a consequence, an effective concentration of the elements may be lowered to an uncritical or at least less critical level, and thus the corrosive attack to the metal surfaces (e.g. to the wire 110a and/or the metal interconnects in regions 218 and 220) may be significantly reduced. Examples for organic compounds 448 that may readily couple or react with e.g. sulfur containing molecules 212 are maleimides, bismaleimides and other derivates of aminoacids and other compounds. The chemical reaction may take place between the compound 448 and the sulfur (selenium, tellurium) of the molecules 212.

In other words, in various embodiments, even though the elements sulfur (S), and/or selenium (Se), and/or tellurium (Te) may still be present in the packaging material 446, they may be hindered from causing the corrosive effect on the metal surfaces, e.g. on the chip metal surface 106m and/or on the metal surfaces of the metal contact structure 110, and/or on other metal surfaces that may be included in the package (not shown, see examples listed in context with other embodiments), by being bound in stable molecules 450.

In various embodiments, the effective concentration of materials that are known to cause the corrosion may be reduced. An advantage of this approach may be that any kind of metal, e.g. metal contact structure 110, e.g. bond wire 110a (e.g. even with copper and silver or alloys or other mixtures thereof as core wire material) and with any kind of coating or doping (e.g. even with noble metal coating such as Pd, Au, Pt or alloys or other mixtures thereof), may be used without running into the corrosion issue. Therefore, the mentioned benefits and advantages of such metal, e.g. metal contact structures 110, e.g. bond wires 110a, other metallic package components like e.g. other metal contact structures 110 (e.g. leadframes 110b), substrates, or bond pads (e.g. chip metal surfaces 106m) can be made use of, without risking that these leadframes, substrate materials, pads, and other components may also be corroded or may be enhancing or catalyzing the corrosion reaction.

In various embodiments, it may be an advantage that the bond wire 110a, especially sections of the bond wire where the core wire material 110a0 may be exposed after electrically contacting the chip 106 with the metal contact structure 110 (e.g. where the metal contact structure 110 may electrically and physically contact the chip 106, e.g. in the first contact region 218 (also referred to as 1" bond region or interconnect region), and/or within the metal contact structure 110, for example at a second contact region 220 (also referred to as $2^{nd}$ bond region, e.g. between the wire 110a and the leadframe 110b), may not need to be protected by any means or process after the bond interconnect has been formed and before the package is molded.

In various embodiments, at least the contact layer 446c may include a stable compound 450 comprising sulfur, selenium and/or tellurium.

In various embodiments, the stable compound 450 may be a reaction product of a component 448 of the packaging material 446 with sulfur, selenium and/or tellurium.

In various embodiments, the stable compound 450 may include an oligomer or a polymer.

In various embodiments, the component 448 of the packaging material 446 may include a maleimide, a bismaleimide, a derivative of an amino acid, and/or tetraethyl orthosilicate.

In various embodiments, the component 448 may include or consist of a filler material, a coloring material, a catalyst, a flexibilizer, a wax, an adhesion promoter, or a stabilizer, e.g. a UV stabilizer, an oxidation stabilizer, or a temperature decomposition stabilizer, of the packaging material 446.

In various embodiments, a common, e.g. sulfur, and/or selenium, and/or tellurium-containing packaging material may be used, for example the packaging material 224 as described in context with FIG. 2, as a basis for the packaging material 446. However, a component 448 may also be included in the packaging material 446, either as a regular component of the packaging material 446, e.g. a filler material, an adhesion promoter, a coloring material, a catalyst, a flexibilizer, a wax, or a stabilizer, e.g. a UV stabilizer, an oxidation stabilizer, or a temperature decomposition stabilizer, etc., or as an additive component without regular functionality for the packaging material. The component 448 may be configured to readily react with the sulfur of the sulfur-containing molecules 212 to form the stable compound 450. The sulfur in the sulfur-containing molecules 212 is to be understood as a representative example for any of the described corrosive molecules. For example, instead of or in addition to sulfur, the molecule 212 may include selenium or tellurium. In this way, a number of chemically reactive sulfur (and/or selenium and/or tellurium), and thus the effective concentration of chemically reactive sulfur (and/or chemically reactive selenium and/or chemically reactive tellurium, e.g. a summed concentration of the three elements) may be less than 10 atomic parts per million, e.g. less than 5 at ppm, e.g. less than 1 at ppm.

In various embodiments, the summed effective concentration of the chemically reactive sulfur, the chemically reactive selenium and the chemically reactive tellurium may be less than 10 atomic parts per million, e.g. less than 5 at ppm, e.g. less than 1 at ppm at least in the contact layer 446c of the packaging material 446.

In various embodiments, the summed effective concentration of the chemically reactive sulfur, the chemically reactive selenium and the chemically reactive tellurium may be less than 10 atomic parts per million, e.g. less than 5 at ppm, e.g. less than 1 at ppm in the packaging material 446 as a whole.

In various embodiments, the element sulfur that may be causing the corrosion reaction may be contained in the molding compound 446 as an organic thiol compound (as an example of the sulfur-containing molecule 212) with a functional group R—S—H. Such thiols are known for their high reactivity with certain metals (Pd, Cu, Ag, . . . ), leading to metal sulfide formation and to ongoing corrosion due to creep effects. However, an effective concentration of the compounds containing thiol groups may be reduced by offering e.g. polarized organic molecules like methyl iodide ($CH_3I$) or ethyl iodide, ($C_2H_5I$) (as examples for the component 448). Such molecules may be readily attacked by the nucleophilic thiol group in order to form organic sulfides of the type R—S—R' (as examples for the stable compound 450). Such organic sulfides may have a lower tendency to attack metals and to form metal-sulfides, and thus a lower corrosive power, than compounds with thiol groups.

In various embodiments, the high reactivity of e.g sulfur containing groups with heavy metals (e.g. Cu, Ag, Bi, Sn, Zn, Sb, . . . ) and their ions may be exploited to couple and bind them as the stable compounds 450 and to thereby reduce their effective concentration.

In various embodiments, the component 448 may be added to the packaging material 446 (the molding compound 446) from the very beginning, in other words before the packaging material 446 is arranged as part of the chip package.

In various embodiments, the component 448 may be added to the packaging material 446 delayed, e.g. after the molding compound 446 lacking the component 448, has already been supplied to the package. In this case, the exemplary sulfur-containing molecules 212, e.g. with the functional group R—S—H (thiol), may first link to relevant surfaces, e.g. metal surfaces, in the package (e.g. wire 110*a*, chip metal surface 106*m*, leadframe 110*b*) and may provide or arrange for an excellent adhesion between the packaging material 446 (e.g. a polymer) and the other surfaces (e.g. the metal surface). Afterwards, by adding the component 448, e.g. molecules like $CH_3I$, excessive exemplary sulfur-containing molecules 212 with the functional group R—S—H (thiol) may react with the added $CH_3I$ and may be captured by forming organic sulfides. Thus, the effective concentration of compounds with the reactive functional group R—S—H (thiol) may be significantly reduced, leading to a lower risk for corrosion reaction.

In various embodiments, as shown in FIG. 4B, the component 448 may include a first portion 448F that may include inorganic or organic functional groups or components that may readily react with e.g. sulfur containing molecules 212, and a second portion 448A.

In various embodiments, the second portion 448A may be or include other constituents of the molding compound 446, e.g. filler particles, catalyst particles, flexibilizer particles, wax particles, adhesion promoter particles, and/or stabilizer particles. Filler particles (mainly based on $SiO_2$) may typically represent 50% or even more of the molding compound volume. Accordingly, they may provide a large area where appropriate coupling agents (the first portion 448F of the component 448; either organic or inorganic) may be attached. Due to an effective coupling of the molecules 212 that contain sulfur (S) (and/or selenium (Se) and/or tellurium (Te) and/or other elements that may cause the corrosion), the effective concentration of the corrosive components may be significantly reduced, leading to less corrosive attack of the metals.

In various embodiments, the component 448, which may serve as a coupling agent for the molecules 212 that contain sulfur (S) (and/or selenium (Se) and/or tellurium (Te) and/or other elements that may cause the corrosion), i.e. the corrosive components, may be attached to/provided in a resin network of the molding compound 446.

Figure 5A:
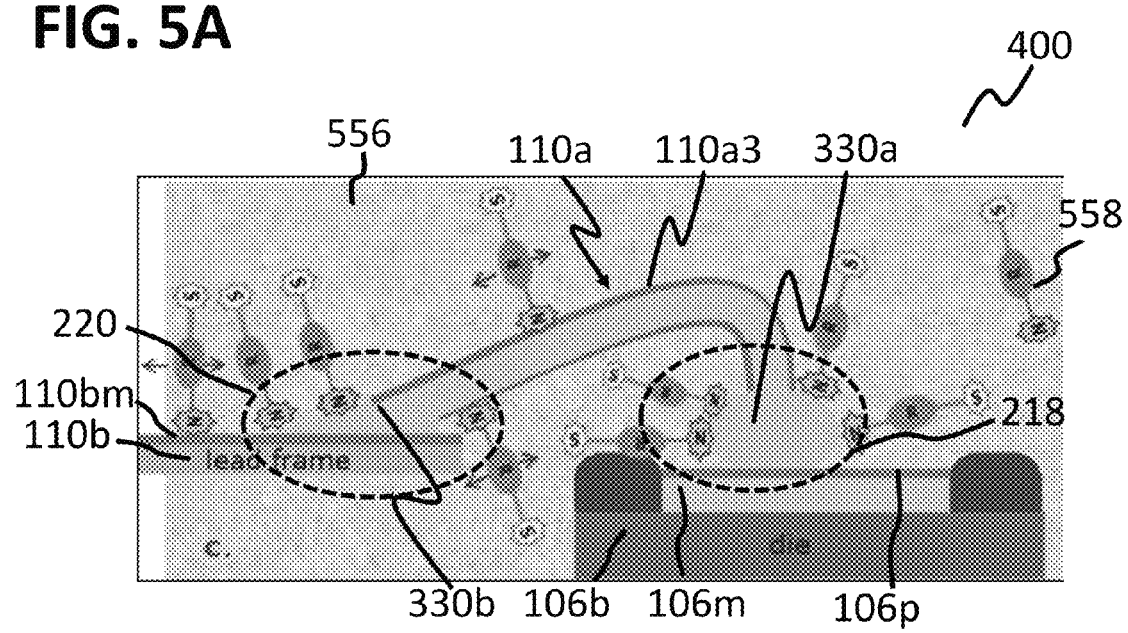
FIG. 5A shows a schematic cross section of a chip package according to various embodiments.

In various embodiments, as shown in FIG. 5A in a cross-sectional schematic view 500, a chip package may be provided.

The chip 106 and the metal contact structure 110 etc. of the chip package of FIG. 5A may be similar or identical to the chip 106 and the metal contact structure 110, etc., of FIG. 2 and FIG. 3, and their description is not repeated here.

However, a packaging material 556 may differ from the packaging material 224 of FIG. 2, from the packaging material 336 of FIG. 3, and from the packaging material 446 of FIG. 4A.

Figure 5B:
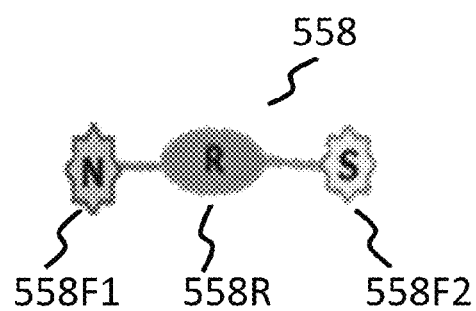
FIG. 5B shows a component of a packaging material of a chip package according to various embodiments.

In various embodiments, as shown in FIG. 5A and FIG. 5B, the described degradation or corrosion may be avoided or significantly reduced by significantly reducing an effective concentration of any materials, compounds, or elements in the assembly and packaging process that are known to cause the corrosion.

In various embodiments, the mentioned elements sulfur (S) and/or selenium (Se) and/or tellurium (Te), and/or other elements that may cause the corrosion reaction may be included in a bill of materials to higher absolute concentrations (e.g. more that 10 at ppm). However, they may be included in, e.g. inorganic or organic, stable compounds 558. The elements (S, Se, Te etc.) may for example be included in compounds 558 that may have at least one other additional functional group 558F1 (see FIG. 5B), e.g. an amino-, azole, silanol, carboxylic and/or other functional group. The at least one other functional group 558F1 may bond more strongly and preferably to metal surfaces (e.g. of the wire 110*a*, the chip metal surface 106*m*, the leadframe 110*b*, and the like) than an, e.g. sulfur, containing functional group 558F2. The elements that may be known to cause the corrosion (S, and/or Se and/or Te and/or others) may then be hindered to react with the metal of the metallic surface(s) (e.g. of the wire, the chip metal surface, the leadframe, etc.) either due to steric reasons or due to a high degree of self-assembled coordination.

In various embodiments, the compound 558 may include two or more functional groups 558F1, 558F2.

In various embodiments, the first functional group 558F1 may include one of an amino, azole, silanol, or carboxyl functional group.

In various embodiments, the compound 558 may be a sterically hindered organic compound. Due to the steric hindrance and/or self-assembled coordination, the functional group 558F2 that may contain e.g. sulfur may not be in close vicinity or direct contact with the metal surface. Accordingly, the catalytic decomposition into smaller, more reactive components may not be taking place, or at least to a much lower extent. Thus, attack and corrosion of the metal surface may not take place or may be significantly reduced. This may be due to the much lower effective concentration of the corrosive functional group at the respective metal surface (in the contact layer 556*c*).

In other words, in various embodiments, even though the elements sulfur (S), and/or selenium (Se), and/or tellurium (Te) may still be present in the packaging material 556, they may be hindered from causing the corrosive effect on the metal surfaces, e.g. on the chip metal surface 106*m* and/or on the metal surfaces of the metal contact structure 110, and/or on other metal surfaces that may be included in the package (not shown, see examples listed in context with other embodiments), by being bound in the stable molecules 558. Furthermore, the corrosive element(s) may be spatially removed from the metal surface by being included in the second functional group 558F2 that may not react with the metal of the metal surface.

In various embodiments, the effective concentration of materials that are known to cause the corrosion may be reduced in at least the contact layer 556c or in the packaging material 556 as a whole. An advantage of this approach may be that any kind of metal, e.g. metal contact structure 110, e.g. bond wire 110a (e.g. even with copper and silver or alloys or other mixtures thereof as core wire material) and with any kind of coating or doping (e.g. even with noble metal coating such as Pd, Au, Pt or alloys or other mixtures thereof), may be used without running into the corrosion issue. Therefore, the mentioned benefits and advantages of such metal, e.g. metal contact structures 110, e.g. bond wires 110a, other metallic package components like e.g. other metal contact structures 110 (e.g. leadframes 110b), substrates, or bond pads (e.g. chip metal surfaces 106m) can be made use of, without risking that these leadframes, substrate materials, pads, and other components may also be corroded or may be enhancing or catalyzing the corrosion reaction.

In various embodiments, it may be an advantage that the bond wire 110a, especially sections of the bond wire where the core wire material 110a0 may be exposed after electrically contacting the chip 106 with the metal contact structure 110 (e.g. where the metal contact structure 110 may electrically and physically contact the chip 106, e.g. in the first contact region 218 (also referred to as 1$^{st}$ bond region or interconnect region), and/or within the metal contact structure 110, for example at a second contact region 220 (also referred to as 2$^{nd}$ bond region, e.g. between the wire 110a and the leadframe 110b), may not need to be protected by any means or process after the bond interconnect has been formed and before the package is molded.

In various embodiments, at least the contact layer 556c may include the stable compound 558 comprising sulfur, selenium and/or tellurium.

In various embodiments, the stable compound 558 may be a condensation of monomers including the corrosive element(s) (S, Se, Te, etc.) to oligomers or polymers (not shown in FIG. 5A and FIG. 5B) including the corrosive element(s) (S, Se, Te, etc.). Thus, an effective concentration of the corrosive component with e.g. sulfur containing functional group may be reduced or minimized by "condensation" of the monomers to oligomers or even polymers.

In various embodiments, the condensation may be initiated by adjusting or modifying a pH-value of the molding compound to either slightly acidic (pH=3-6) or to slightly alkaline (pH=7-10) conditions.

In contrast to especially short chain monomers, such oligomers and polymers may be thermodynamically much more stable and may not represent easy leaving groups. They may require significantly higher temperatures (>250° C.) in order to thermally decompose to smaller and more reactive (=corrosive) fragments. Such high temperatures may not be typically applied to microelectronic devices. Thus, attack and corrosion of the metal surface may not take place or may be significantly reduced, because the effective concentration of the corrosive fragment, the monomer, may be much lower.

In various embodiments, the stable compound 558 may be configured to form large networks (not shown in FIG. 5A and FIG. 5B). Thus, an effective concentration of the corrosive component with e.g. a sulfur containing functional group may be reduced or minimized by capping with e.g. the compound 558 that tends to form large networks. One example for such a compound is TEOS (tetraethylorthosilicate). Moderate thermal treatment may lead to condensation between the —C—Si—O—H endings to either —C—Si—O—Si—C— networks, or with e.g. sulfur containing functional groups to —C—Si—S—Si—C— networks. Due to the network formation, the effective concentration of the corrosive fragment may be significantly reduced.

FIG. 6 shows a process flow 600 for a method of forming a chip package according to various embodiments.

The method may include electrically contacting a metal contact structure to a chip metal surface of a chip (in 610), and at least partially encapsulating the chip and the metal contact structure with packaging material, thereby forming a contact layer of packaging material, the contact layer being in physical contact with the chip and/or with the metal contact structure, wherein, in the contact layer, a summed concentration of chemically reactive sulfur, chemically reactive selenium and chemically reactive tellurium is less than 10 atomic parts per million (in 620).

In various embodiments, a chip package is provided. The chip package may include a chip including a chip metal surface, a metal contact structure electrically contacting the chip metal surface, and packaging material including a contact layer being in physical contact with the chip metal surface and/or with the metal contact structure; wherein at least in the contact layer of the packaging material, a summed concentration of chemically reactive sulfur, chemically reactive selenium and chemically reactive tellurium is less than 10 atomic parts per million.

In various embodiments, in the packaging material as a whole, a summed concentration of chemically reactive sulfur, chemically reactive selenium and chemically reactive tellurium may be less than 10 atomic parts per million.

In various embodiments, at least the contact layer may include a stable compound comprising sulfur, selenium and/or tellurium.

In various embodiments, the stable compound may be a reaction product of a component of the packaging material with sulfur, selenium and/or tellurium.

In various embodiments, the stable compound may include an oligomer or a polymer.

In various embodiments, the component of the packaging material may include a maleimide, a bismaleimide, a derivative of an amino acid, and/or tetraethyl orthosilicate.

In various embodiments, the component may be a filler material, a coloring material, or a glue material of the packaging material.

In various embodiments, the stable compound may include a first functional and a second functional group including the sulfur, selenium and/or tellurium, wherein the first functional group has a higher affinity for bonding with the chip metal surface and/or with the metal contact structure than the second functional group.

In various embodiments, the first functional group may include one of an amino, azole, silanol, or carboxyl functional group.

In various embodiments, a method of forming a chip package is provided. The method may include electrically contacting a metal contact structure to a chip metal surface of a chip; and at least partially encapsulating the chip and the metal contact structure with packaging material, thereby forming a contact layer of packaging material, the contact layer being in physical contact with the chip and/or with the metal contact structure, wherein, in the contact layer, a summed concentration of chemically reactive sulfur, chemically reactive selenium and chemically reactive tellurium may be less than 10 atomic parts per million.

In various embodiments, the method may further include adding a component to the packaging material, the component reacting with sulfur, selenium and/or tellurium to form a stable compound comprising sulfur, selenium and/or tellurium.

In various embodiments, the adding the component to the packaging material may be executed after the at least partially encapsulating the chip and the metal contact structure with the packaging material.

In various embodiments, the method may further include adjusting a pH value of the packaging material to a range between 3 and 6 or to a range between 7 and 10.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
a chip comprising a chip metal surface;
a metal contact structure electrically contacting the chip metal surface; and
a packaging material comprising a contact layer being in physical contact with the chip metal surface and/or with the metal contact structure;
wherein at least in the contact layer of the packaging material, a summed concentration of chemically reactive sulfur, chemically reactive selenium and chemically reactive tellurium is less than 10 atomic parts per million.

2. The chip package of claim 1,
wherein, in the packaging material as a whole, a summed concentration of chemically reactive sulfur, chemically reactive selenium and chemically reactive tellurium is less than 10 atomic parts per million.

3. The chip package of claim 1,
wherein at least the contact layer comprises a stable compound comprising sulfur, selenium and/or tellurium.

4. The chip package of claim 3,
wherein the stable compound is a reaction product of a component of the packaging material with sulfur, selenium and/or tellurium.

5. The chip package of claim 3,
wherein the stable compound comprises an oligomer or a polymer.

6. The chip package of claim 4,
wherein the component of the packaging material comprises a maleimide, a bismaleimide, a derivative of an amino acid, and/or tetraethyl orthosilicate.

7. The chip package of claim 4,
wherein the component comprises a filler material, a coloring material, a catalyst, a flexibilizer, a wax, an adhesion promoter, or a stabilizer, e.g. a UV stabilizer, an oxidation stabilizer, or a temperature decomposition stabilizer, of the packaging material.

8. The chip package of claim 3,
wherein the stable compound comprises a first functional group and a second functional group comprising the sulfur, selenium and/or tellurium,
wherein the first functional group has a higher affinity for bonding with the chip metal surface and/or with the metal contact structure than the second functional group.

9. The chip package of claim 8,
wherein the first functional group comprises one of an amino, azole, silanol, or carboxyl functional group.

10. A method of forming a chip package, comprising:
electrically contacting a metal contact structure to a chip metal surface of a chip; and
at least partially encapsulating the chip and the metal contact structure with packaging material, thereby forming a contact layer of packaging material, the contact layer being in physical contact with the chip and/or with the metal contact structure,
wherein, in the contact layer, a summed concentration of chemically reactive sulfur, chemically reactive selenium and chemically reactive tellurium is less than 10 atomic parts per million.

11. The method of claim 10, further comprising:
adding a component to the packaging material, the component reacting with sulfur, selenium and/or tellurium to form a stable compound comprising sulfur, selenium and/or tellurium.

12. The method of claim 11,
wherein the adding the component to the packaging material is executed after the at least partially encapsulating the chip and the metal contact structure with the packaging material.

13. The method of claim 10, further comprising:
adjusting a pH value of the packaging material to a range between 3 and 6 or to a range between 7 and 10.

* * * * *